(12) United States Patent
Park et al.

(10) Patent No.: US 12,410,365 B2
(45) Date of Patent: Sep. 9, 2025

(54) SOLVENT-FREE CURABLE COMPOSITION, CURED FILM PRODUCED USING SAME COMPOSITION, COLOR FILTER COMPRISING SAME CURED FILM, AND DISPLAY DEVICE

(71) Applicant: SAMSUNG SDI CO., LTD., Yongin-si (KR)

(72) Inventors: Onyou Park, Suwon-si (KR); Kyunghee Kang, Suwon-si (KR); Yonghee Kang, Suwon-si (KR); Jonggi Kim, Suwon-si (KR); Bumjin Lee, Suwon-si (KR); Minjee Park, Suwon-si (KR); Injae Lee, Suwon-si (KR); Seongmi Jeon, Suwon-si (KR); Minkyeol Chung, Suwon-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 106 days.

(21) Appl. No.: 18/249,233

(22) PCT Filed: Jan. 17, 2022

(86) PCT No.: PCT/KR2022/000792
§ 371 (c)(1),
(2) Date: Apr. 14, 2023

(87) PCT Pub. No.: WO2022/164102
PCT Pub. Date: Aug. 4, 2022

(65) Prior Publication Data
US 2023/0383179 A1    Nov. 30, 2023

(30) Foreign Application Priority Data
Jan. 27, 2021   (KR) .......... 10-2021-0011897

(51) Int. Cl.
*C09K 11/02*    (2006.01)
*C08F 22/10*    (2006.01)
(Continued)

(52) U.S. Cl.
CPC ........ *C09K 11/025* (2013.01); *C08F 22/1006* (2020.02); *C09D 11/101* (2013.01);
(Continued)

(58) Field of Classification Search
CPC ..... C09K 11/025; C09K 11/70; C09K 11/565; C09K 11/883; C08F 22/1006; C09D 11/30; C09D 11/101; G02B 5/223
See application file for complete search history.

(56) References Cited

U.S. PATENT DOCUMENTS

| 5,648,425 A | 7/1997 | Everaerts et al. |
| 11,760,926 B2 * | 9/2023 | Kang ............ C09K 11/025 252/301.36 |

(Continued)

FOREIGN PATENT DOCUMENTS

| CN | 001073962 A | 7/1993 |
| CN | 106589205 A | 4/2017 |

(Continued)

OTHER PUBLICATIONS

International Search Report of PCT/KR2022/000792, Apr. 29, 2022, 5 pp.

*Primary Examiner* — Bijan Ahvazi
(74) *Attorney, Agent, or Firm* — Womble Bond Dickinson (US) LLP

(57) ABSTRACT

Disclosed are a solvent-free curable composition including quantum dots; and a curable monomer represented by Chemical Formula 1, a cured layer manufactured using the composition, a color filter including the cured layer, and a display device including the color filter.

(Continued)

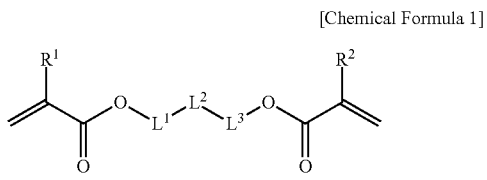

[Chemical Formula 1]

In Chemical Formula 1, each substituent is as defined in the specification.

13 Claims, 8 Drawing Sheets

(51) Int. Cl.
  *C09D 11/101* (2014.01)
  *C09D 11/30* (2014.01)
  *C09K 11/56* (2006.01)
  *C09K 11/70* (2006.01)
  *C09K 11/88* (2006.01)
  *G02B 5/22* (2006.01)

(52) U.S. Cl.
  CPC ............ *C09D 11/30* (2013.01); *C09K 11/565* (2013.01); *C09K 11/70* (2013.01); *C09K 11/883* (2013.01); *G02B 5/223* (2013.01)

(56) References Cited

U.S. PATENT DOCUMENTS

| | | | |
|---|---|---|---|
| 11,866,624 B2* | 1/2024 | Choi | C08F 220/18 |
| 2008/0153937 A1 | 6/2008 | Oguni et al. | |
| 2017/0240728 A1 | 8/2017 | Lee et al. | |
| 2018/0345638 A1* | 12/2018 | Smith | C09K 11/025 |
| 2019/0129302 A1* | 5/2019 | Youn | G03F 7/105 |
| 2019/0243242 A1 | 8/2019 | Paek et al. | |
| 2020/0002604 A1 | 1/2020 | Youn et al. | |
| 2020/0103709 A1 | 4/2020 | Madigan et al. | |
| 2020/0231871 A1 | 7/2020 | Kim et al. | |
| 2020/0248068 A1* | 8/2020 | Choi | G02F 1/017 |
| 2021/0024819 A1* | 1/2021 | Kang | C09K 11/025 |
| 2021/0139730 A1 | 5/2021 | Isonaka et al. | |
| 2024/0084194 A1 | 3/2024 | Choi et al. | |

FOREIGN PATENT DOCUMENTS

| | | |
|---|---|---|
| CN | 107102513 A | 8/2017 |
| CN | 110119066 A | 8/2019 |
| CN | 110305531 A | 10/2019 |
| CN | 110669177 A | 1/2020 |
| CN | 110845986 A | 2/2020 |
| CN | 111051469 A | 4/2020 |
| CN | 111303689 A | 6/2020 |
| CN | 111454711 A | 7/2020 |
| EP | 1777700 A1 | 4/2007 |
| JP | 2017-048355 A | 3/2017 |
| JP | 2019-112516 A | 7/2019 |
| JP | 2020-021033 A | 2/2020 |
| JP | 2020-522591 A | 7/2020 |
| JP | 2020-118971 A | 8/2020 |
| JP | 2020-126234 A | 8/2020 |
| KR | 10-2007-0052749 A | 5/2007 |
| KR | 10-2013-0135145 A | 12/2013 |
| KR | 10-2016-0111142 A | 9/2016 |
| KR | 10-2018-0047317 A | 5/2018 |
| KR | 10-2018-0090554 A | 8/2018 |
| KR | 10-2019-0108732 A | 9/2019 |
| KR | 10-2020-0016926 A | 2/2020 |
| KR | 10-2020-0022326 A | 3/2020 |
| KR | 10-2020-0095988 A | 8/2020 |
| TW | 202035579 A | 10/2020 |
| WO | 2017/141046 A1 | 8/2017 |
| WO | WO 2018/123103 A1 | 7/2018 |

* cited by examiner

SOLVENT-FREE CURABLE COMPOSITION, CURED FILM PRODUCED USING SAME COMPOSITION, COLOR FILTER COMPRISING SAME CURED FILM, AND DISPLAY DEVICE

CROSS-REFERENCE TO RELATED APPLICATIONS

This application is a U.S. National Phase Patent Application of International Application Number PCT/KR2022/000792, filed on Jan. 17, 2022, which claims priority to Korean Patent Application Number 10-2021-0011897, filed on Jan. 27, 2021, the entire content of each of which is incorporated herein by reference.

TECHNICAL FIELD

This disclosure relates to a solvent-free curable composition, a cured layer manufactured using the composition, a color filter including the cured layer, and a display device including the same.

BACKGROUND ART

In the case of general quantum dots, due to surface characteristics having hydrophobicity, a solvent in which it is dispersed is limited, and thus, it is difficult to introduce into a polar system such as a binder or a curable monomer.

For example, even in the case of a quantum dot ink composition being actively researched, a polarity is relatively low in an initial step and it may be dispersed in a solvent used in a curable composition having a high hydrophobicity. Therefore, because 20 wt % or more of quantum dots are difficult to be included based on the total amount of the composition, it is impossible to increase photoefficiency of the ink over a certain level. Even though the quantum dots are additionally added and dispersed in order to increase photoefficiency, a viscosity exceeds a range capable of ink-jetting and thus processability may not be satisfied.

In order to achieve the viscosity range capable of ink-jetting, an attempt has been made to lower an ink solid content by dissolving 50 wt % or more of a solvent based on the total amount of the composition, which also provides a somewhat satisfactory result in terms of viscosity. However, it may be considered to be a satisfactory result in terms of a viscosity, but nozzle drying due to solvent volatilization and nozzle clogging during ink-jetting and reduction of a single thickness as time passed after ink-jetting may become worse and it is difficult to control a thickness deviation after curing. Thus, it is difficult to apply it to actual processes.

Therefore, a solvent-free type quantum dot ink that does not include a solvent is the most desirable form to be applied to an actual process. The current technique of applying a quantum dot itself to a solvent type composition is now limited to a certain extent.

As reported so far, since the solvent type composition includes about 20 wt % to about 25 wt % of non-surface modified quantum dots through ligand substitution and the like based on the total amount of the solvent type composition and thus has a viscosity limit, photoefficiency and an absorption rate are difficult to increase. On the other hand, a method of reducing a content of the quantum dots and increasing a content of a light diffusing agent (scatterer) has been attempted but fails in improving a sedimentation problem or the low photoefficiency.

DISCLOSURE

Technical Problem

An embodiment provides a solvent-free curable composition including a curable monomer including a linking group having a substituent and quantum dots.

Another embodiment provides a cured layer manufactured using the solvent-free curable composition.

Another embodiment provides a color filter including the cured layer.

Another embodiment provides a display device including the color filter.

Technical Solution

An embodiment provides a solvent-free curable composition including quantum dots; and a curable monomer represented by Chemical Formula 1.

[Chemical Formula 1]

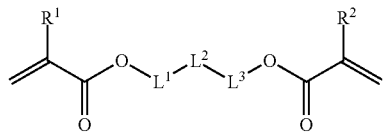

In Chemical Formula 1,
$R^1$ and $R^2$ are each independently a hydrogen atom or a substituted or unsubstituted C1 to C10 alkyl group,
$L^1$ is a single bond or an unsubstituted C1 to C20 alkylene group,
$L^2$ is a substituted C1 to C20 alkylene group, and
$L^3$ is a substituted or unsubstituted C1 to C20 alkylene group.

Chemical Formula 1 may be represented by any one of Chemical Formula 1-1 to Chemical Formula 1-3.

[Chemical Formula 1-1]

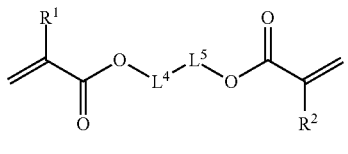

[Chemical Formula 1-2]

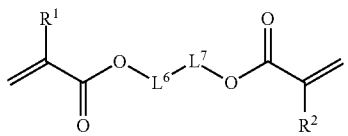

[Chemical Formula 1-3]

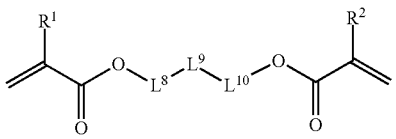

In Chemical Formula 1-1 to Chemical Formula 1-3,
$R^1$ and $R^2$ are each independently a hydrogen atom or a substituted or unsubstituted C1 to C10 alkyl group,
$L^4$ is an unsubstituted C1 to C20 alkylene group,
$L^5$ to $L^7$ are each independently a substituted C1 to C20 alkylene group, and $L^8$ to $L^{10}$ are each independently a substituted or unsubstituted C1 to C20 alkylene group, provided that at least one of $L^8$ to $L^{10}$ is necessarily a substituted C1 to C20 alkylene group.

The curable monomer represented by Chemical Formula 1 may have a vapor pressure of $1.0 \times 10^{-4}$ torr to $5.0 \times 10^{-2}$ torr.

The curable monomer represented by Chemical Formula 1 may have a viscosity of 4 cps to 10 cps.

The curable monomer represented by Chemical Formula 1 may be represented by any one of Chemical Formula 2 to Chemical Formula 6.

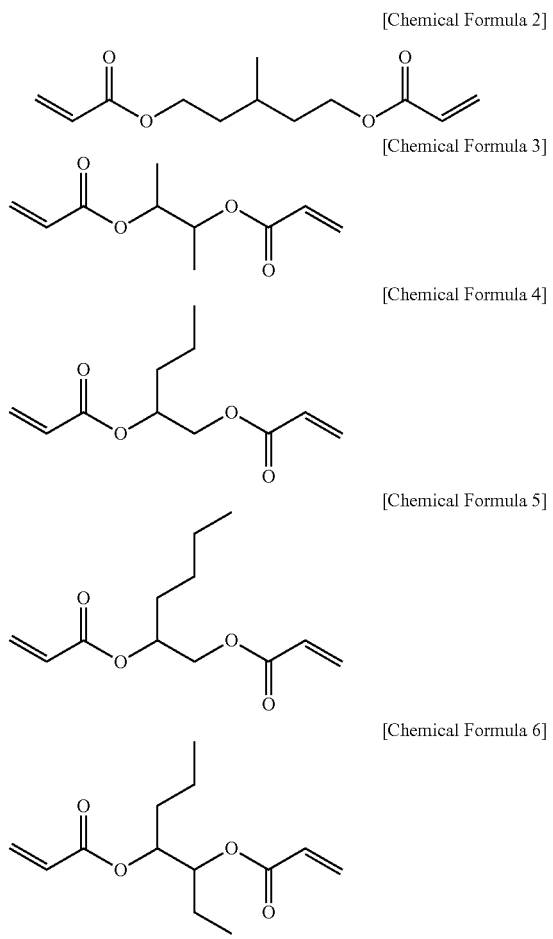

[Chemical Formula 2]

[Chemical Formula 3]

[Chemical Formula 4]

[Chemical Formula 5]

[Chemical Formula 6]

The solvent-free curable composition may have a viscosity of 20 cps to 40 cps.

The quantum dots may have a maximum fluorescence emission wavelength in the range of 500 nm to 680 nm.

The solvent-free curable composition may include 5 wt % to 60 wt % of the quantum dots; and 40 wt % to 95 wt % of the curable monomer represented by Chemical Formula 1 based on the total amount of the solvent-free curable composition.

The solvent-free curable composition may further include a polymerization initiator, a light diffusing agent, or a combination thereof.

The light diffusing agent may include barium sulfate, calcium carbonate, titanium dioxide, zirconia, or a combination thereof.

The solvent-free curable composition may further include a polymerization inhibitor; malonic acid; 3-amino-1,2-propanediol; a silane-coupling agent; a leveling agent; a fluorine-based surfactant; or a combination thereof.

Another embodiment provides a cured layer manufactured using the solvent-free curable composition.

Another embodiment provides a color filter including the cured layer.

Another embodiment provides a display device including the color filter.

Other embodiments of the present invention are included in the following detailed description.

Advantageous Effects

The present invention provides a solvent-free curable composition having excellent storage stability and excellent ink ejection property, even if retention time is long, by structurally modifying the curable monomer to include a linking group having a substituent to lower viscosity thereof itself and also that of a composition including the same and thus to improve ink-jetting property thereof.

BEST MODE

Figure 1:
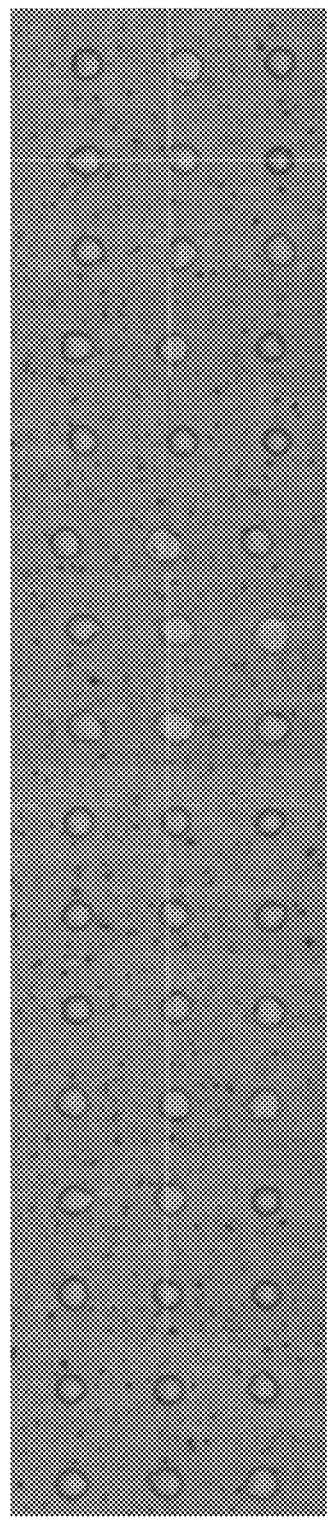
FIG. 1 is a photograph showing a solvent-free curable composition of Example 1 immediately after the ink-jetting.

Hereinafter, embodiments of the present invention are described in detail. However, these embodiments are exemplary, the present invention is not limited thereto and the present invention is defined by the scope of claims.

As used herein, when specific definition is not otherwise provided, "alkyl group" refers to a C1 to C20 alkyl group, "alkenyl group" refers to a C2 to C20 alkenyl group, "cycloalkenyl group" refers to a C3 to C20 cycloalkenyl group, "heterocycloalkenyl group" refers to a C3 to C20 heterocycloalkenyl group, "aryl group" refers to a C6 to C20 aryl group, "arylalkyl group" refers to a C6 to C20 arylalkyl group, "alkylene group" refers to a C1 to C20 alkylene group, "arylene group" refers to a C6 to C20 arylene group, "alkylarylene group" refers to a C6 to C20 alkylarylene group, "heteroarylene group" refers to a C3 to C20 heteroarylene group, and "alkoxylene group" refers to a C1 to C20 alkoxylene group.

As used herein, when specific definition is not otherwise provided, "substituted" refers to replacement of at least one hydrogen atom by a substituent selected from a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

As used herein, when specific definition is not otherwise provided, "hetero" refers to inclusion of at least one heteroatom of N, O, S, and P, in the chemical formula.

As used herein, when specific definition is not otherwise provided, "(meth)acrylate" refers to both "acrylate" and "methacrylate", and "(meth)acrylic acid" refers to "acrylic acid" and "methacrylic acid".

As used herein, when specific definition is not otherwise provided, the term "combination" refers to mixing or copolymerization.

In the present specification, when a definition is not otherwise provided, hydrogen is bonded at the position when a chemical bond is not drawn in chemical formula where supposed to be given.

In addition, in the present specification, when a definition is not otherwise provided, "*" refers to a linking point with the same or different atom or chemical formula.

The present invention relates to a curable composition for a color filter applied to a display device and specifically, a solvent-free curable ink composition including quantum dots, which has recently been established as a new technology in the display field.

The quantum dot-containing photosensitive ink composition applied to a quantum dot display in general consists of a curable monomer, a binder resin, an initiator, a solvent, an additive, and the like, and in addition, the quantum dots and a light diffusing agent are included therein to secure color characteristics, wherein the quantum dots have a function of converting incident blue light into red light and green light after forming a single film.

However, when the quantum dot-containing photosensitive ink composition includes a solvent, since there are problems of nozzle drying due to volatilization of the solvent during the ink-jetting, nozzle-clogging, single film reduction after the ink-jetting, and the like and in addition, severe thickness deviation after the curing, recent studies on a quantum dot-containing curable ink composition using no solvent, that is, a solvent-free curable ink composition have been actively made.

The solvent-free quantum dot-containing curable ink composition includes a multi-functional monomer in order to well disperse quantum dots and well form a matrix through UV curing or thermal curing. Specifically, a HDDA (1,6-hexanediol diacrylate) monomer, which is widely used, has viscosity of about 6.2 cps, and when prepared into a curable ink composition, the viscosity becomes about 26.3 cps. In order to apply this curable ink composition with relatively high viscosity to a process, the curable ink composition should be ink-jetted after lowering the viscosity of the ink composition by increasing a temperature of a nozzle head during the ink-jetting. However, when the temperature of the nozzle head is increased, there occur issues such as the nozzle clogging in the nozzle head, insufficient shooting, and the like due to the temperature increase.

Accordingly, the present inventors develop a solvent-free curable composition capable of dispersing quantum dots as well as conventional monomers such as HDDA and thus well form a matrix through UV curing or thermal curing, minimizing quantum efficiency deterioration of the quantum dots after the exposure and thermal process, and further maintaining storage stability and ink ejection property even during long retention time.

Hereinafter, each component constituting the solvent-free curable composition is described in detail.

Curable Monomer

The curable monomer included in the solvent-free curable composition according to the embodiment is a monomer having carbon-carbon double bonds at both terminal ends, and is specifically represented by Chemical Formula 1.

[Chemical Formula 1]

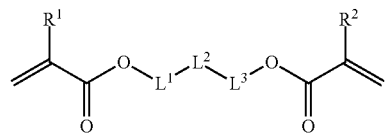

In Chemical Formula 1, $R^1$ and $R^2$ are each independently a hydrogen atom or a substituted or unsubstituted C1 to C10 alkyl group, $L^1$ is a single bond or an unsubstituted C1 to C20 alkylene group, $L^2$ is a substituted C1 to C20 alkylene group, and $L^3$ is a substituted or unsubstituted C1 to C20 alkylene group.

The curable monomer represented by Chemical Formula 1 necessarily includes a substituent such as an alkyl group and the like in a linking group included between (meth)acrylate groups at both terminal ends, which may lower viscosity of the curable monomer represented by Chemical Formula 1 itself and also, lower that of a solvent-free curable composition including the same and thus significantly improve ink-jetting property of the composition and further contribute to minimizing deterioration of quantum efficiency of the quantum dots to be described later after the exposure and thermal process.

In addition, the solvent-free curable composition of an embodiment includes the curable monomer represented by Chemical Formula 1 and thus may exhibit almost no viscosity change over time at a higher temperature than room temperature and thereby very excellent storage stability and maintain the ink ejection property without deterioration even if the retention time is prolonged during the ink-jetting process.

For example, Chemical Formula 1 may be represented by any one of Chemical Formula 1-1 to Chemical Formula 1-3, but is not necessarily limited thereto.

[Chemical Formula 1-1]

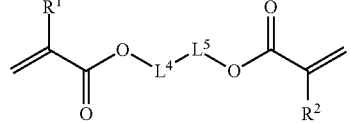

[Chemical Formula 1-2]

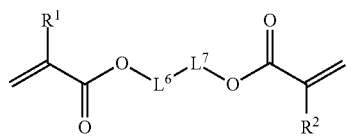

[Chemical Formula 1-3]

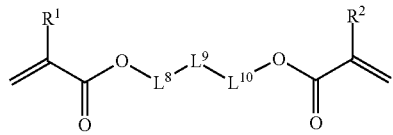

In Chemical Formula 1-1 to Chemical Formula 1-3, $R^1$ and $R^2$ are each independently a hydrogen atom or a substituted or unsubstituted C1 to C10 alkyl group, $L^4$ is an unsubstituted C1 to C20 alkylene group, $L^5$ to $L^7$ are each independently a substituted C1 to C20 alkylene group, and $L^8$ to $L^{10}$ are each independently a substituted or unsubstituted C1 to C20 alkylene group, provided that at least one of $L^8$ to $L^{10}$ is necessarily a substituted C1 to C20 alkylene group.

For example, the curable monomer represented by Chemical Formula 1 may have a vapor pressure of $1.0 \times 10^{-4}$ torr to $5.0 \times 10^{-2}$ torr.

For example, the curable monomer represented by Chemical Formula 1 may have a viscosity of 4 cps to 10 cps.

For example, the curable monomer represented by Chemical Formula 1 may be represented by any one of Chemical Formula 2 to Chemical Formula 6, but is not necessarily limited thereto.

[Chemical Formula 2]

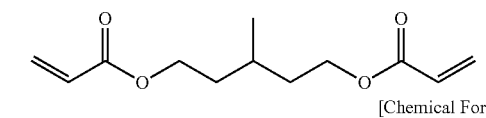

[Chemical Formula 3]

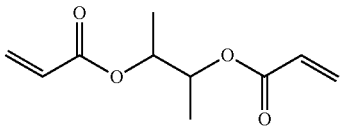

[Chemical Formula 4]

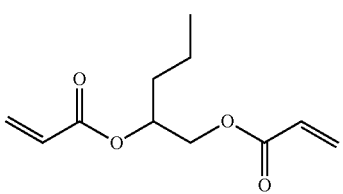

[Chemical Formula 5]

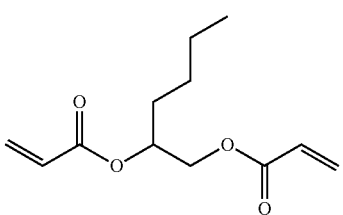

[Chemical Formula 6]

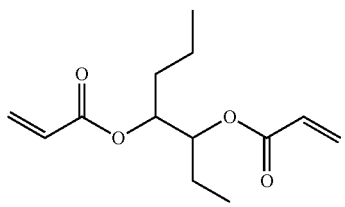

For example, the solvent-free curable composition may have a viscosity of 20 cps to 40 cps.

The curable monomer represented by Chemical Formula 1 may be included in an amount of 40 wt % to 95 wt %, for example 45 wt % to 90 wt %, for example 45 wt % to 85 wt %, or for example 50 wt % to 80 wt % based on the total weight of the solvent-free curable composition. When the content of the curable monomer represented by Chemical Formula 1 is within the above range, a solvent-free curable composition having a viscosity capable of ink-jetting may be prepared, and also the quantum dots in the prepared solvent-free curable composition may have excellent dispersibility, and thus optical properties may also be improved.

For example, the curable monomer represented by Chemical Formula 1 may have a molecular weight of 180 g/mol to 1,000 g/mol. When the molecular weight of the curable monomer represented by Chemical Formula 1 is within the above range, it may be advantageous for ink-jetting because the viscosity of the composition is not increased without inhibiting the optical properties of the quantum dots.

In addition, the solvent-free curable composition according to the embodiment may further include a monomer generally used in conventional thermosetting or photocurable compositions in addition to the curable monomer represented by Chemical Formula 1, and the monomer may further include, for example, an oxetane-based compound such as bis[1-ethyl(3-oxetanyl)]methyl ether.

Quantum Dots

For example, the quantum dots included in the solvent-free curable composition absorb light in a wavelength region of 360 nm to 780 nm, for example 400 nm to 780 nm and emits fluorescence in a wavelength region of 500 nm to 700 nm, for example 500 nm to 580 nm, or emits fluorescence in a wavelength region of 600 nm to 680 nm. That is, the quantum dots may have a maximum fluorescence emission wavelength (fluorescence $\lambda_{em}$) at 500 nm to 680 nm.

The quantum dots may independently have a full width at half maximum (FWHM) of 20 nm to 100 nm, for example 20 nm to 50 nm. When the quantum dots have a full width at half maximum (FWHM) of the ranges, color reproducibility is increased when used as a color material in a color filter due to high color purity.

The quantum dots may independently be an organic material, an inorganic material, or a hybrid (mixture) of an organic material and an inorganic material.

The quantum dots may independently be composed of a core and a shell surrounding the core, and the core and the shell may independently have a structure of a core, a core/shell, a core/first shell/second shell, an alloy, an alloy/shell, or the like, which is composed of Group II-IV, Group III-V, and the like, but are not limited thereto.

For example, the core may include at least at least one material selected from CdS, CdSe, CdTe, ZnS, ZnSe, ZnTe, HgS, HgSe, HgTe, GaN, GaP, GaAs, InP, InAs, and an alloy thereof, but is not necessarily limited thereto. The shell surrounding the core may include at least at least one material selected from CdSe, ZnSe, ZnS, ZnTe, CdTe, PbS, TiO, SrSe, HgSe, and an alloy thereof, but is not necessarily limited thereto.

In an embodiment, since an interest in an environment has been recently much increased over the whole world, and a restriction of a toxic material also has been fortified, a cadmium-free light emitting material (InP/ZnS, InP/ZnSe/ZnS, etc.) having little low quantum efficiency (quantum yield) but being environmentally-friendly instead of a light emitting material having a cadmium-based core is used, but not necessarily limited thereto.

In the case of the quantum dots of the core/shell structure, an entire size including the shell (an average particle diameter) may be 1 nm to 15 nm, for example, 5 nm to 15 nm.

For example, the quantum dots may independently include red quantum dots, green quantum dots, or a combination thereof. The red quantum dots may independently have an average particle diameter of 10 nm to 15 nm. The green quantum dots may independently have an average particle diameter of 5 nm to 8 nm.

On the other hand, for the dispersion stability of the quantum dots, the solvent-free curable composition according to an embodiment may further include a dispersing agent to include quantum dots in the form of a quantum dot dispersion. The dispersing agent helps uniform dispersibility of light conversion materials such as quantum dots in the solvent-free curable composition and may include a non-ionic, anionic, or cationic dispersing agent. Specifically, the dispersing agent may be polyalkylene glycol or esters thereof, a polyoxy alkylene, a polyhydric alcohol ester alkylene oxide addition product, an alcohol alkylene oxide addition product, a sulfonate ester, a sulfonate salt, a carboxylate ester, a carboxylate salt, an alkyl amide alkylene oxide addition product, an alkyl amine and the like, and they may be used alone or in a mixture of two or more. The dispersing agent may be used in an amount of 0.1 wt % to 100 wt %, for example 10 wt % to 20 wt % based on the solid content of the light conversion material such as quantum dots.

The quantum dots may be surface-modified with a conventional quantum dot surface-modifying material (e.g., a thiol-based compound, etc.) or may not be surface-modified therewith.

The quantum dots may be included in an amount of 5 wt % to 60 wt %, for example 10 wt % to 60 wt %, for example 20 wt % to 50 wt %, or for example 30 wt % to 50 wt % based on the total amount of the solvent-free curable composition. When the quantum dots (e.g., quantum dot dispersion) are included within the above range, the light conversion rate is improved and pattern characteristics and development characteristics are not impaired, and thus excellent processability may be obtained.

Polymerization Initiator The solvent-free curable composition according to an embodiment may further include a polymerization initiator, for example, a photopolymerization initiator, a thermal polymerization initiator, or a combination thereof.

The photopolymerization initiator is a generally-used initiator for a photosensitive resin composition, for example an acetophenone-based compound, a benzophenone-based compound, a thioxanthone-based compound, a benzoin-based compound, a triazine-based compound, an oxime-based compound, an aminoketone-based compound, and the like, but is not necessarily limited thereto.

Examples of the acetophenone-based compound may be 2,2'-diethoxy acetophenone, 2,2'-dibutoxy acetophenone, 2-hydroxy-2-methylpropinophenone, p-t-butyltrichloroacetophenone, p-t-butyldichloroacetophenone, 4-chloroacetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may be benzophenone, benzoyl benzoate, benzoyl methyl benzoate, 4-phenyl benzophenone, hydroxybenzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may be thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may be benzoin, benzoin methyl ether, benzoin ethyl ether, benzoin isopropyl ether, benzoin isobutyl ether, benzyldimethylketal, and the like.

Examples of the triazine-based compound may be 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may be O-acyloxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Specific examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and the like.

Examples of the aminoketone-based compound may be 2-benzyl-2-dimethylamino-1-(4-morpholinophenyl)-butanone-1, and the like.

The photopolymerization initiator may further include a carbazole-based compound, a diketone-based compound, a sulfonium borate-based compound, a diazo-based compound, an imidazole-based compound, a biimidazole-based compound, and the like, besides the compounds.

The photopolymerization initiator may be used with a photosensitizer capable of causing a chemical reaction by absorbing light and becoming excited and then, transferring its energy.

Examples of the photosensitizer may be tetraethylene glycol bis-3-mercapto propionate, pentaerythritol tetrakis-3-mercapto propionate, dipentaerythritol tetrakis-3-mercapto propionate, and the like.

Examples of the thermal polymerization initiator may be peroxide, specifically benzoyl peroxide, dibenzoyl peroxide, lauryl peroxide, dilauryl peroxide, di-tert-butyl peroxide, cyclohexane peroxide, methyl ethyl ketone peroxide, hydroperoxide (e.g., tert-butyl hydroperoxide, cumene hydroperoxide), dicyclohexyl peroxydicarbonate, 2,2-azobis(isobutyronitrile), t-butyl perbenzoate, and the like, for example 2,2'-azobis-2-methylpropinonitrile, but are not necessarily limited thereto, and any of which is well known in the art may be used.

The polymerization initiator may be included in an amount of 0.1 wt % to 5 wt %, for example 1 wt % to 4 wt % based on the total amount of the solvent-free curable composition. When the polymerization initiator is included in the ranges, it is possible to obtain excellent reliability due to sufficient curing during exposure or thermal curing and to prevent deterioration of transmittance due to non-reaction initiators, thereby preventing deterioration of optical properties of the quantum dots.

Light Diffusing Agent

The solvent-free curable composition according to an embodiment may further include a light diffusing agent.

For example, the light diffusing agent may include barium sulfate ($BaSO_4$), calcium carbonate ($CaCO_3$), titanium dioxide ($TiO_2$), zirconia ($ZrO_2$), or a combination thereof.

The light diffusing agent may reflect unabsorbed light in the aforementioned quantum dots and allows the quantum dots to absorb the reflected light again. That is, the light diffusing agent may increase an amount of light absorbed by the quantum dots and increase light conversion efficiency of the curable composition.

The light diffusing agent may have an average particle diameter (D50) of 150 nm to 250 nm, and specifically 180 nm to 230 nm. When the average particle diameter of the light diffusing agent is within the ranges, it may have a better light diffusing effect and increase light conversion efficiency.

The light diffusing agent may be included in an amount of 1 wt % to 20 wt %, for example 5 wt % to 10 wt % based on the total amount of the solvent-free curable composition. When the light-diffusing agent is included in an amount of less than 1 wt % based on the total amount of the solvent-free curable composition, it is difficult to expect an effect of improving light conversion efficiency by using the light-diffusing agent, and when it is included in an amount of greater than 20 wt %, quantum dot sedimentation may occur.

Other Additives

For stability and dispersion improvement of the quantum dot, the solvent-free curable composition according to an embodiment may further include a polymerization inhibitor.

The polymerization inhibitor may include a hydroquinone-based compound, a catechol-based compound, or a combination thereof, but is not necessarily limited thereto. When the solvent-free curable composition according to an embodiment further includes the hydroquinone-based compound, the catechol-based compound, or the combination thereof, room temperature cross-linking during exposure after printing (coating) the solvent-free curable composition may be prevented.

For example, the hydroquinone-based compound, catechol-based compound or combination thereof may include hydroquinone, methyl hydroquinone, methoxyhydroquinone, t-butyl hydroquinone, 2,5-di-t-butyl hydroquinone, 2,5-bis(1,1-dimethylbutyl) hydroquinone, 2,5-bis(1,1,3,3-tetramethylbutyl) hydroquinone, catechol, t-butyl catechol, 4-methoxyphenol, pyrogallol, 2,6-di-t-butyl-4-methylphenol, 2-naphthol, tris(N-hydroxy-N-nitrosophenylaminato-O, O')aluminium, or a combination thereof, but is not necessarily limited thereto.

The hydroquinone-based compound, catechol-based compound, or combination thereof may be used in the form of a dispersion, and the polymerization inhibitor in the dispersion form may be included in an amount of 0.001 wt % to 3 wt %, for example 0.1 wt % to 2 wt % based on the total amount of the solvent-free curable composition. When the polymerization inhibitor is included within the above range, the problem of aging at room temperature may be solved, and at the same time, reduction of sensitivity and surface peeling may be prevented.

In addition, the solvent-free curable composition according to an embodiment may include may further include malonic acid; 3-amino-1,2-propanediol; a silane-based coupling agent; a leveling agent; a fluorine-based surfactant; or a combination thereof in order to improve heat resistance and reliability.

For example, the solvent-free curable composition according to an embodiment may further include a silane-based coupling agent having a reactive substituent such as a vinyl group, a carboxyl group, a methacryloxy group, an isocyanate group, an epoxy group, and the like in order to improve close-contacting properties with a substrate.

Examples of the silane-based coupling agent may be trimethoxysilyl benzoic acid, γ-methacryl oxypropyl trimethoxysilane, vinyl triacetoxysilane, vinyl trimethoxysilane, γ-isocyanate propyl triethoxy silane, γ-glycidoxy propyl trimethoxysilane, β-epoxycyclohexyl)ethyl trimethoxy silane, and the like, and these may be used alone or in a mixture of two or more.

The silane-based coupling agent may be included in an amount of 0.01 parts by weight to 10 parts by weight based on 100 parts by weight of the solvent-free curable composition. When the silane-based coupling agent is included within the range, close-contacting properties, storage capability, and the like are improved.

In addition, the solvent-free curable composition may further include a surfactant, for example a fluorine-based surfactant as needed in order to improve coating properties and inhibit generation of spots, that is, improve leveling performance.

The fluorine-based surfactant may have a low weight average molecular weight of 4,000 g/mol to 10,000 g/mol, and specifically 6,000 g/mol to 10,000 g/mol. In addition, the fluorine-based surfactant may have a surface tension of 18 mN/m to 23 mN/m (measured in 0.1% polyethylene glycol monomethylether acetate (PGMEA) solution). When the fluorine-based surfactant has a weight average molecular weight and a surface tension within the ranges, leveling performance may be further improved, and excellent characteristics may be provided when slit coating as high-speed coating is applied since film defects may be less generated by preventing a spot generation during the high-speed coating and suppressing a vapor generation.

Examples of the fluorine-based surfactant may be, BM-1000©, and BM-1100© (BM Chemie Inc.); MEGAFACE F 142D®, F 172©, F 173©, and F 183© Dainippon Ink Kagaku Kogyo Co., Ltd.); FULORAD FC-135©, FULORAD FC-170C®, FULORAD FC-430®, and FULORAD FC-431©(Sumitomo 3M Co., Ltd.); SURFLON S-112©, SURFLON S-113©, SURFLON S-131©, SURFLON S-141©, and SURFLON S-145® (ASAHI Glass Co., Ltd.); and SH-28PA®, SH-190®, SH-193®, SZ-6032®, and SF-8428®, and the like (Toray Silicone Co., Ltd.); F-482, F-484, F-478, F-554 and the like from DIC Co., Ltd.

In addition, the solvent-free curable composition according to an embodiment may include a silicone-based surfactant in addition to the fluorine-based surfactant. Specific examples of the silicone-based surfactant may be TSF400, TSF401, TSF410, TSF4440, and the like of Toshiba Silicone Co., Ltd., but is not limited thereto.

The surfactant may be included in an amount of 0.01 parts by weight to 5 parts by weight, for example 0.1 parts by weight to 2 parts by weight based on 100 parts by weight of the solvent-free curable composition. When the surfactant is included within the ranges, foreign materials are less produced in a sprayed composition.

In addition, the solvent-free curable composition according to an embodiment may further include other additives such as an antioxidant, a stabilizer, and the like in a predetermined amount, unless properties are deteriorated.

Another embodiment provides a cured layer manufactured using the solvent-free curable composition and a color filter including the cured layer.

One of methods of manufacturing the cured layer may include coating the solvent-free curable composition on a substrate using an ink-jet spraying method to form a pattern (S1); and curing the pattern (S2).

(S1) Formation of Pattern

The solvent-free curable composition may desirably be coated to be 0.5 μm to 20 μm on a substrate in an ink-jet spraying method. The ink-jet spraying method may form a pattern by spraying a single color per each nozzle and thus repeating the spraying as many times as the needed number of colors, but the pattern may be formed by simultaneously spraying the needed number of colors through each ink-jet nozzle in order to reduce processes.

(S2) Curing

The obtained pattern is cured to obtain a pixel. Herein, the curing method may be thermal curing or photocuring process. The thermal curing process may be performed at greater than or equal to 100° C., desirably, in a range of 100° C. to 300° C., and more desirably, in a range of 160° C. to 250° C. The photocuring process may include irradiating an actinic ray such as a UV ray of 190 nm to 450 nm, for example 200 nm to 500 nm. The irradiating is performed by using a light source such as a mercury lamp with a low pressure, a high pressure, or an ultrahigh pressure, a metal halide lamp, an argon gas laser, and the like. An X ray, an electron beam, and the like may be also used as needed.

The other method of manufacturing the cured layer may include manufacturing a cured layer using the aforementioned solvent-free curable composition by a lithographic method as follows.

(1) Coating and Film Formation

The solvent-free curable composition is coated to have a desired thickness, for example, a thickness ranging from 2 μm to 10 μm, on a substrate which undergoes a predetermined pretreatment, using a spin or slit coating method, a roll coating method, a screen-printing method, an applicator method, and the like. Then, the coated substrate is heated at a temperature of 70° C. to 90° C. for 1 minute to 10 minutes to remove a solvent and to form a film.

(2) Exposure

The resultant film is irradiated by an actinic ray such as a UV ray of 190 nm to 450 nm, for example 200 nm to 500 nm after putting a mask with a predetermined shape to form a desired pattern. The irradiating is performed by using a light source such as a mercury lamp with a low pressure, a high pressure, or an ultrahigh pressure, a metal halide lamp, an argon gas laser, and the like. An X ray, an electron beam, and the like may be also used as needed.

Exposure process uses, for example, a light dose of 500 mJ/cm² or less (with a 365 nm sensor) when a high-pressure mercury lamp is used. However, the light dose may vary depending on types of each component of the curable composition, its combination ratio, and a dry film thickness.

(3) Development

After the exposure process, an alkali aqueous solution is used to develop the exposed film by dissolving and removing an unnecessary part except the exposed part, forming an image pattern. In other words, when the alkali developing solution is used for the development, a non-exposed region is dissolved, and an image color filter pattern is formed.

(4) Post-Treatment

The developed image pattern may be heated again or irradiated by an actinic ray and the like for curing, in order to accomplish excellent quality in terms of heat resistance, light resistance, close-contacting properties, crack-resistance, chemical resistance, high strength, storage stability, and the like.

Another embodiment provides a display device including the color filter, for example, a display device such as LCD, LED, or OLED.

MODE FOR INVENTION

Hereinafter, the present invention is illustrated in more detail with reference to examples. These examples, however, are not in any sense to be interpreted as limiting the scope of the invention.

(Synthesis of Curable Monomer)

Synthesis Example 1

10 g of 3-methyl-1,5-pentanediol was dissolved in 100 g of cyclohexane in a round flask. Subsequently, 3.4 g of acrylic acid and 2.4 g of methane sulfonic acid were added thereto and reacted therewith at 100° C. for 20 hours, synthesizing a curable monomer represented by Chemical Formula 2 (a molecular weight: 226 g/mol, a vapor pressure at 25° C.: $2.0 \times 10^{-3}$ mmHg).

[Chemical Formula 2]

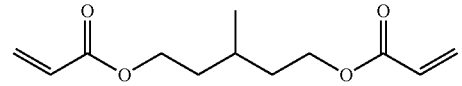

Synthesis Example 2

10 g of 2,3-butanediol was dissolved in 100 g of cyclohexane in a round flask. Subsequently, 17.6 g of acrylic acid and 3.2 g of methane sulfonic acid were added thereto and reacted therewith at 100° C. for 20 hours, synthesizing a curable monomer represented by Chemical Formula 3 (a molecular weight: 198 g/mol).

[Chemical Formula 3]

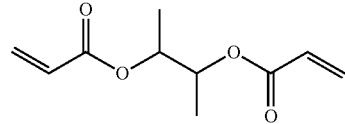

Synthesis Example 3

10 g of 1,2-pentanediol was dissolved in 100 g of cyclohexane in a round flask. Subsequently, 15.2 g of acrylic acid and 2.8 g of methane sulfonic acid were added thereto and reacted therewith at 100° C. for 20 hours, synthesizing a curable monomer represented by Chemical Formula 4 (a molecular weight: 212 g/mol).

[Chemical Formula 4]

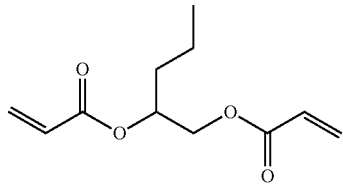

Synthesis Example 4

10 g of 1,2-hexanediol was dissolved in 100 g of cyclohexane in a round flask. Subsequently, 13.4 g of acrylic acid and 2.4 g of methane sulfonic acid were added thereto and then, reacted therewith at 100° C. for 20 hours, synthesizing a curable monomer represented by Chemical Formula 5 (a molecular weight: 226 g/mol).

[Chemical Formula 5]

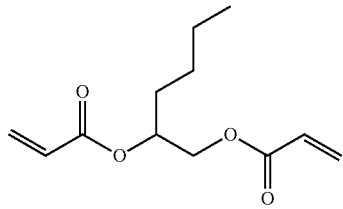

Synthesis Example 5

10 g of 3,4-heptanediol was dissolved in 100 g of cyclohexane in a round flask. Subsequently, 12.0 g of acrylic acid and 2.2 g of methane sulfonic acid were added thereto and reacted therewith at 100° C. for 20 hours, synthesizing a curable monomer represented by Chemical Formula 6 (a weight average molecular weight: 240 g/mol).

[Chemical Formula 6]

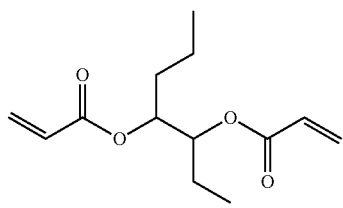

Evaluation 1: Viscosity Measurement of Curable Monomers

The curable monomer of Synthesis Example 1 and HDDA (1,6-hexanediol diacrylate) (MIRAMER M200, Miwon Specialty Chemical Co., Ltd.) (a vapor pressure at 25° C.: $1.0 \times 10^{-3}$ mmHg) were measured with respect to initial viscosity at 25° C. by using a viscometer (C60/1 spindle, a shear rate: 600, HAAKE Rheostress 6000, Thermo Fisher Scientific Inc.), and the results are shown in Table 1.

TABLE 1

|  | Viscosity (cps) |
|---|---|
| Curable monomer of Synthesis Example 1 | 5.0 |
| HDDA | 6.2 |

As shown in Table 1, the curable monomer of Synthesis Example 1 including a linking group having a substituent exhibited low viscosity, compared with HDDA including a linking group having no substituent.

(Preparation of Surface-Modified Quantum Dots)

Preparation Example

After putting a magnetic bar in a 3-necked round-bottomed flask, green quantum dot dispersion solution (InP/ZnSe/ZnS, Hansol Chemical; quantum dot solid content of 23 wt %) was put therein. The compound represented by Chemical Formula Q (a ligand) was added thereto and then, stirred at 80° C. under a nitrogen atmosphere. When a reaction was completed, after decreasing the temperature down to room temperature (23° C.), the quantum dot reaction solution was added to cyclohexane, catching precipitates. The precipitates were separated from the cyclohexane through centrifugation and then, sufficiently dried in a vacuum oven for one day, obtaining surface-modified quantum dots.

(*Synthesis of Compound represented by Chemical Formula Q: 100 g of PH-4 (Hannong Chemical Inc.) was put in a 2-neck round-bottomed flask and then, sufficiently dissolved in 300 mL of THF. 15.4 g of NaOH and 100 mL of water were injected thereinto at 0° C. and then, sufficiently dissolved, until a clear solution was obtained. A solution obtained by dissolving 73 g of para-toluene sulfonic chloride in 100 mL of THF was slowly injected thereinto at 0° C. Injection was carried out for 1 hour, and the obtained mixture was stirred at room temperature for 12 hours. When a reaction was completed, an excessive amount of methylene chloride was added thereto and then, stirred, and a NaHCO$_3$ saturated solution was added thereto, which was followed by extraction, titration, and water removal. After removing the solvent, the residue was dried in a dry oven for 24 hours. 50 g of the dried product was put in a 2 necked round-bottomed flask and sufficiently stirred in 300 mL of ethanol. Subsequently, 27 g of thiourea was added thereto and dispersed therein and then, refluxed at 80° C. for 12 hours. Then, an aqueous solution prepared by dissolving 4.4 g of NaOH in 20 mL of water was injected thereinto, while further stirred for 5 hours, an excessive amount of methylene chloride was added thereto, and then, a hydrochloric acid aqueous solution was added thereto, which was sequentially followed by extraction, titration, water removal, and solvent removal. The obtained product was dried in a vacuum oven for 24 hours, obtaining a compound represented by Chemical Formula Q.)

[Chemical Formula Q]

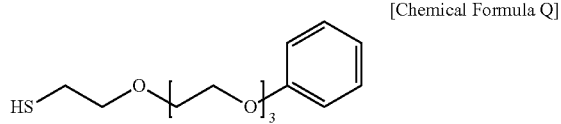

(Preparation of Solvent-Free Curable Compositions)

Example 1

Quantum dot dispersion was obtained by mixing the green quantum dot solid of the preparation example with the curable monomer of Synthesis Example 1 in the same weight ratio and stirring the mixture for 12 hours.

The curable monomer of Synthesis Example 1 was added to the quantum dot dispersion for dilution, and then, a polymerization inhibitor (methylhydroquinone, Tokyo Chemical Industry Co., Ltd.) was added thereto and then, stirred for 5 minutes. Subsequently, a photoinitiator (TPO-L, Polynetron Co., Ltd.) was added thereto, and a light diffusing agent (rutile type $TiO_2$, a particle diameter: 180 nm) was added thereto. Then, the corresponding crude liquid was stirred for 1 hour, preparing a solvent-free curable composition. The solvent-free curable composition had a composition shown in Table 2. (Illustrating Example 1 as an example, a solvent-free curable composition was prepared by mixing 40 g of the green quantum dot solid with 40 g of the curable monomer of Synthesis Example 1 to prepare the quantum dot dispersion, adding 10.5 g of the curable monomer of Synthesis Example 1 and 0.5 g of the polymerization inhibitor to the quantum dot dispersion and then, stirring the mixture for 5 minutes, and subsequently, adding 3 g of the photoinitiator and 4 g of the light diffusing agent thereto and then, stirring them.)

TABLE 2

(unit: g)

| | Amount |
|---|---|
| Quantum dot solid content | 40 |
| Curable monomer (Synthesis Example 1) | 50.5 |
| Polymerization inhibitor | 0.5 |
| Photoinitiator | 3 |
| Light diffusing agent | 4 |

Example 2

A solvent-free curable composition was prepared according to the same method as Example 1 except that the curable monomer of Synthesis Example 2 was used instead of the curable monomer of Synthesis Example 1.

Example 3

A solvent-free curable composition was prepared according to the same method as Example 1 except that the curable monomer of Synthesis Example 3 was used instead of the curable monomer of Synthesis Example 1.

Example 4

A solvent-free curable composition was prepared according to the same method as Example 1 except that the curable monomer of Synthesis Example 4 was used instead of the curable monomer of Synthesis Example 1.

Example 5

A solvent-free curable composition was prepared according to the same method as Example 1 except that the curable monomer of Synthesis Example 5 was used instead of the curable monomer of Synthesis Example 1.

Comparative Example 1

A solvent-free curable composition was prepared according to the same method as Example 1 except that HDDA (1,6-hexanediol diacrylate) was used instead of the curable monomer of Synthesis Example 1.

Evaluation 2: Evaluation of Optical Properties

The solvent-free curable compositions according to Example 1 and Comparative Example 1 were respectively coated to be 15 μm thick on a yellow photoresist (YPR) with a spin coater (830 rpm, 5 seconds, Opticoat MS-A150, Mikasa Co., Ltd.) and exposed to light with 5000 mJ (83° C., 10 seconds) under a nitrogen atmosphere with a 395 nm UV exposer. Subsequently, 2 cm×2 cm single film specimens were loaded in an integrating sphere equipment (QE-2100, Otsuka Electronics, Co., Ltd.) to measure external quantum efficiency of the quantum dots (external quantum efficiency after the exposure). Then, the loaded single film specimens were dried (thermally-processed) in a 180° C. nitrogen atmosphere drying furnace for 30 minutes and measured again with respect to the external quantum efficiency (external quantum efficiency after the thermal process) of the quantum dots, and the results are shown in Table 3.

TABLE 3

(unit: %)

| | External quantum efficiency of quantum dots after exposure | External quantum efficiency of quantum dots after thermal process |
|---|---|---|
| Example 1 | 31.0 | 29.1 |
| Comparative Example 1 | 30.9 | 29.0 |

Referring to Table 3, the solvent-free curable composition of Example 1 and the solvent-free curable composition of Comparative Example 1 all minimize deterioration of the quantum efficiency of the quantum dots.

Evaluation 3: Evaluation of Storage Stability (40° C.)

In order to evaluate storage stability of the solvent-free curable compositions according to Examples 1 to 5 and Comparative Example 1, initial viscosity and viscosity after 14 days (while the temperature condition was constantly maintained) of the compositions were respectively measured at 40° C. with a viscometer (RV-2 spindle, 23 rpm, DV-H, Brookfield Engineering Laboratories, Inc.), and then, each viscosity difference between the initial viscosity and the viscosity after 14 days is shown in Table 4.

TABLE 4

| | Example 1 | Example 2 | Example 3 | Example 4 | Example 5 | Comparative Example 1 |
|---|---|---|---|---|---|---|
| Difference in viscosity | 0.2 | 0.4 | 0.4 | 0.3 | 0.1 | 2.6 |

(unit: cps)

Referring to Table 4, the solvent-free curable composition according to an embodiment exhibited excellent storage stability, compared with that of the solvent-free curable composition according to Comparative Example 1.

Evaluation 4: Evaluation of Ink-Jetting Properties by Retention Time

Figure 2:
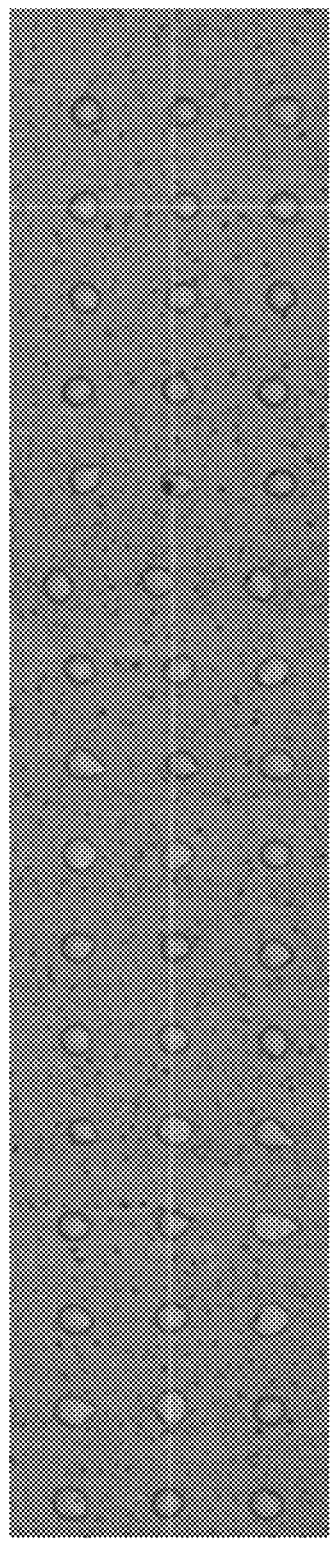
FIG. 2 is a photograph showing the ink-jetting of the solvent-free curable composition of Example 1 immediately after 10 minutes retention time.
Figure 3:
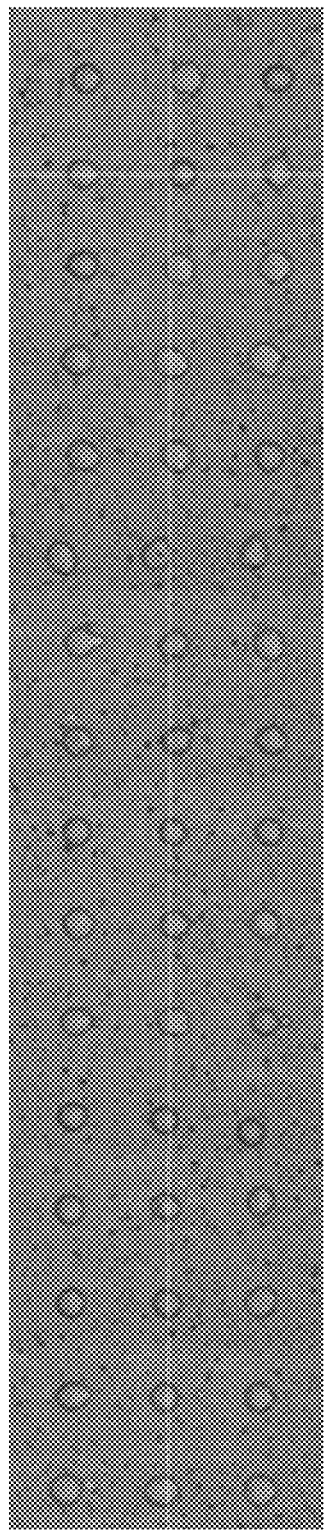
FIG. 3 is a photograph showing the ink-jetting of the solvent-free curable composition according to Example 1 immediately after 30 minutes retention time.
Figure 4:
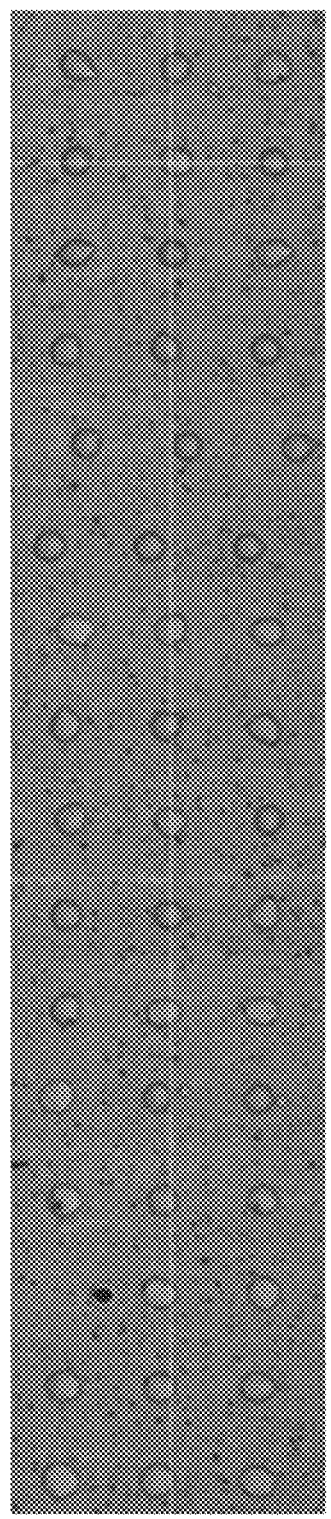
FIG. 4 is a photograph showing the ink-jetting of the solvent-free curable composition according to Example 1 immediately after 60 minutes retention time.
Figure 5:
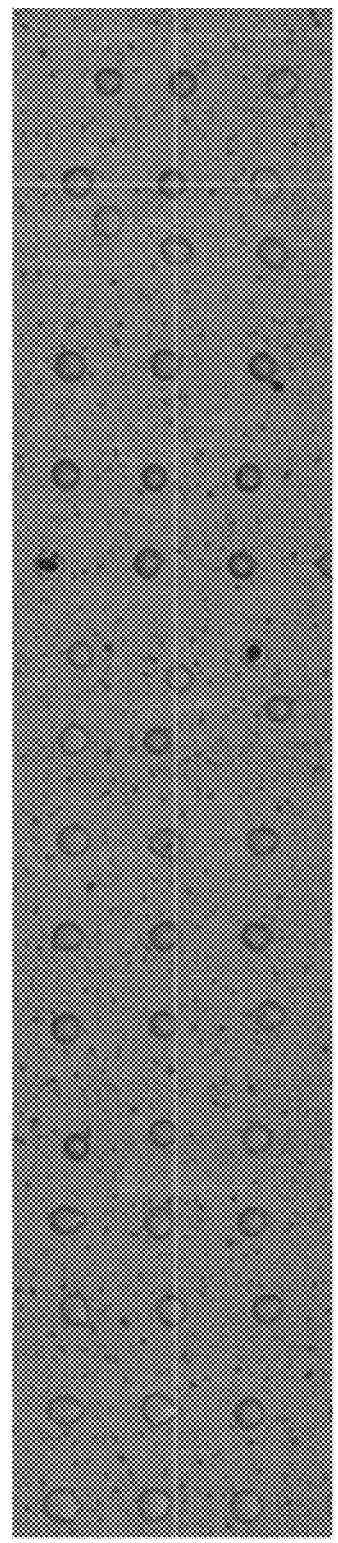
FIG. 5 is a photograph showing the ink-jetting of the solvent-free curable composition according to Example 1 immediately after 24 hours retention time.
Figure 6:
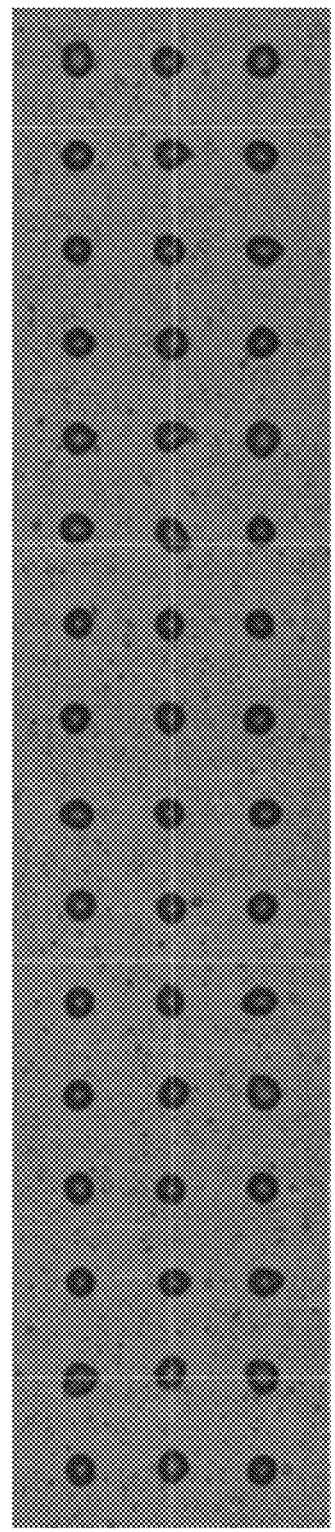
FIG. 6 is a photograph immediately after ink-jetting of a solvent-free curable composition of Comparative Example 1.
Figure 7:
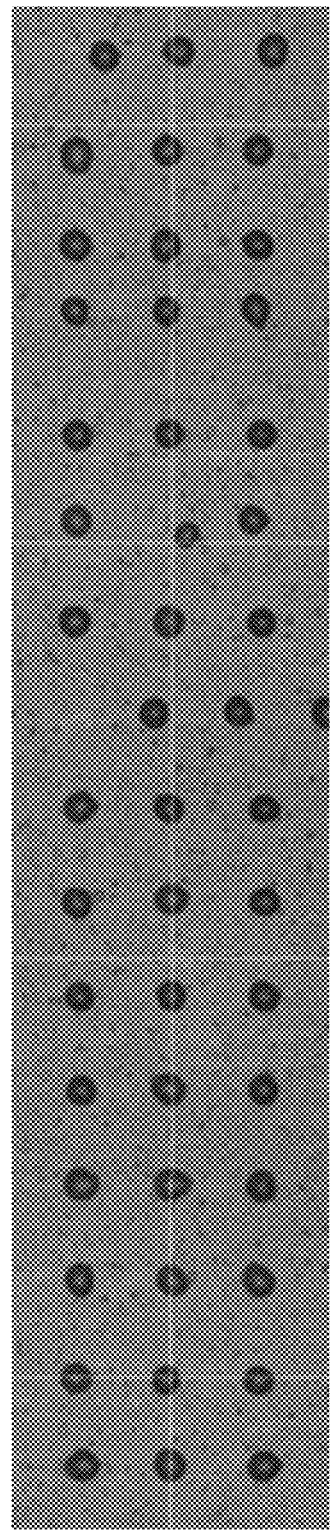
FIG. 7 is a photograph showing the ink-jetting of the solvent-free curable composition of Comparative Example 1 after 10 minutes retention time.
Figure 8:
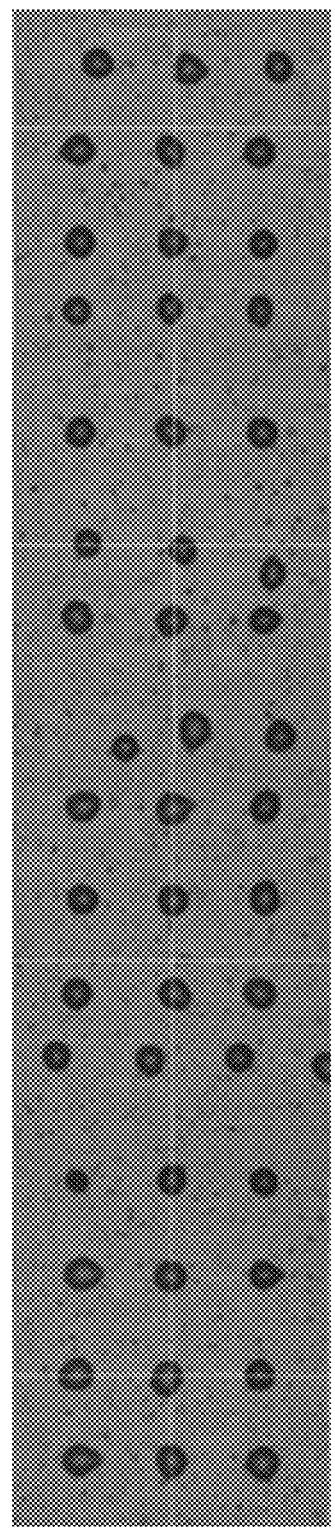
FIG. 8 is a photograph showing the ink-jetting of the solvent-free curable composition of Comparative Example 1 after 30 minutes retention time.

In order to evaluate ink-jetting properties of the solvent-free curable compositions according to Examples 1 to 5 and Comparative Example 1, each composition was ink-jetted and taken a photograph, and the results are shown in FIGS. 1 to 8.

Referring to FIGS. 1 to 8, the solvent-free curable composition according to an embodiment maintained ejection property even if the retention time was long, but the solvent-free curable composition according to Comparative Example 1 exhibited deteriorated ejection property despite short retention time.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A solvent-free curable composition, comprising quantum dots; and
a curable monomer represented by Chemical Formula 1:

[Chemical Formula 1]

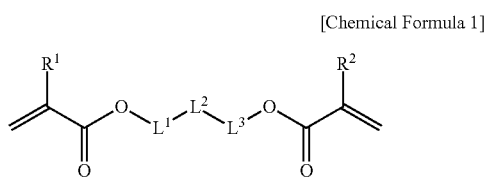

wherein, in Chemical Formula 1,
$R^1$ and $R^2$ are each independently a hydrogen atom or a substituted or unsubstituted C1 to C10 alkyl group,
$L^1$ is a single bond,
$L^2$ is a substituted C1 alkylene group, and
$L^3$ is a substituted or unsubstituted C1 alkylene group.

2. The solvent-free curable composition of claim 1, wherein the curable monomer represented by Chemical Formula 1 has a vapor pressure of $1.0 \times 10^{-4}$ torr to $5.0 \times 10^{-2}$ torr at 25° C.

3. The solvent-free curable composition of claim 2, wherein the curable monomer represented by Chemical Formula 1 has a viscosity of 4 cps to 10 cps at 25° C.

4. The solvent-free curable composition of claim 1, wherein the curable monomer represented by Chemical Formula 1 is represented by any one of Chemical Formula 3 to Chemical Formula 6:

[Chemical Formula 3]

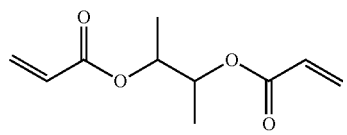

[Chemical Formula 4]

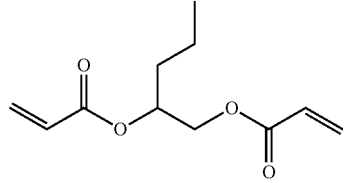

[Chemical Formula 5]

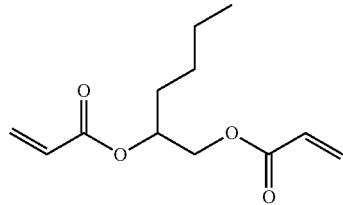

[Chemical Formula 6]

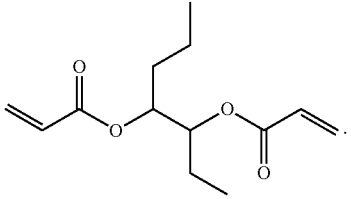

5. The solvent-free curable composition of claim 1, wherein the solvent-free curable composition has a viscosity of 20 cps to 40 cps at 25° C.

6. The solvent-free curable composition of claim 1, wherein the quantum dots have a maximum fluorescence emission wavelength at 500 nm to 680 nm.

7. The solvent-free curable composition of claim 1, wherein
the solvent-free curable composition comprises
5 wt % to 60 wt % of the quantum dots; and
40 wt % to 95 wt % of the curable monomer represented by Chemical Formula 1, based on the total amount of the solvent-free curable composition.

8. The solvent-free curable composition of claim 1, wherein the solvent-free curable composition further comprises a polymerization initiator, a light diffusing agent, or a combination thereof.

9. The solvent-free curable composition of claim 8, wherein the light diffusing agent comprises barium sulfate, calcium carbonate, titanium dioxide, zirconia, or a combination thereof.

10. The solvent-free curable composition of claim 1, wherein the solvent-free curable composition further comprises a polymerization inhibitor; malonic acid; 3-amino-1,2-propanediol; a silane-based coupling agent; a leveling agent; a fluorine-based surfactant; or a combination thereof.

11. A cured layer manufactured using the solvent-free curable composition of claim 1.

12. A color filter comprising the cured layer of claim 11.

13. A display device comprising the color filter of claim 12.

* * * * *